United States Patent [19]

Porter

[11] Patent Number: 4,865,331

[45] Date of Patent: Sep. 12, 1989

[54] DIFFERENTIAL TEMPERATURE SEAL

[75] Inventor: Warren W. Porter, Escondido, Calif.

[73] Assignee: NCR Corporation, Dayton, Ohio

[21] Appl. No.: 245,251

[22] Filed: Sep. 15, 1988

[51] Int. Cl.⁴ ............................................. F16J 15/02
[52] U.S. Cl. ....................................... 277/26; 277/22;
 220/901
[58] Field of Search .................... 277/22, 26, 203, 165;
 220/80, 81 R, 901; 285/187, 904

[56] References Cited

U.S. PATENT DOCUMENTS

| | | | |
|---|---|---|---|
| 3,056,615 | 10/1962 | Breitenstein | 285/187 |
| 3,269,874 | 8/1966 | Moeller | 136/211 |
| 3,361,285 | 1/1968 | Alleume | 220/901 X |
| 3,361,430 | 1/1968 | Reid | 277/26 |
| 3,367,492 | 2/1968 | Pratt et al. | 220/901 X |
| 3,578,541 | 5/1971 | Tariel | 220/901 X |
| 3,630,533 | 12/1971 | Butler et al. | 277/153 |
| 3,649,738 | 3/1972 | Anderson et al. | 174/15 R |
| 3,682,346 | 8/1972 | Sterrett | 220/901 X |
| 3,912,107 | 10/1975 | Baumann | 220/901 X |
| 4,050,607 | 9/1977 | Smith | 220/414 |
| 4,079,968 | 3/1978 | Wilkins | 285/187 X |
| 4,183,042 | 1/1980 | Novak et al. | 357/82 |
| 4,355,827 | 10/1982 | Ehret | 285/98 |
| 4,461,398 | 7/1984 | Argy | 220/901 X |
| 4,658,847 | 4/1987 | McCrone | 277/205 X |

OTHER PUBLICATIONS

"Bimettallic Seal Solves Cryogenic Sealing Problems", by William A. Prince, (1964) Hydraulics & Pneumatics, Nov. 1964.

*Primary Examiner*—William A. Cuchlinski, Jr.
*Assistant Examiner*—Jeffrey J. Hohenshell
*Attorney, Agent, or Firm*—Wilbert Hawk, Jr.; Stephen F. Jewett; Jack R. Penrod

[57] ABSTRACT

A simple, yet fluid tight seal for a cryogenic enclosure. The seal between two portions of the enclosure becomes tighter as the temperature is lowered because both portions contract against a third member which does not contract with temperature to the same degree. Further, this contraction is elastic and therefore the enclosure may be disassembled and reassembled numerous times without damage to the seal. This is particularly advantageous for sealing lids or containers for cryogenic electronic components.

12 Claims, 2 Drawing Sheets

DIFFERENTIAL TEMPERATURE SEAL

BACKGROUND OF THE INVENTION

The present invention relates to a fluid seal and more particularly to a fluid-tight seal for a cryogenically cooled enclosure.

The problem of sealing a joint between two interconnecting pieces that is subsequently cooled to a cryogenic temperature has been previously recognized. In part, this is the problem addressed in U.S. Pat. No. 3,630,533 by Butler et al., issued Dec. 28, 1971, entitled DYNAMIC SEAL FOR CRYOGENIC FLUIDS. The other problem addressed in Butler et al. is the high temperature sealing problem, which did have an influence on the overall design approach taken. The approach of Butler et al. uses a circular sealing ring made from a fluorocarbon plastic material to seal the two metal tubular couplings. The sealing ring is pressed onto a radially outward surface of one of the metal couplings. The sealing ring has a radially inward protruding annular rib which elastically and inelastically deforms (i.e. cold flows) as the sealing ring is pressed into place. This arrangement effects a sealing engagement between the sealing ring and the metal coupling at temperatures within the range of 70° F. to −423° F. At normal temperatures the inner surface of the sealing ring is held in sealing engagement by the elastic preload induced by the initial interference press fit and deformation of the protruding annular rib. In addition to the pre-load, a circumferential tension is generated in the sealing ring as the temperature decreases because its coefficient of thermal expansion and contraction is greater than the coefficient of thermal expansion and contraction of the metal coupling. Thus, because of the differences in the expansion coefficients of the sealing ring and the metal coupling that it is pressed onto, the sealing engagement between these two members of two different materials becomes tighter as the temperature decreases.

With such a design, each time two metal tubular couplings are to be sealed together, a complex plastic sealing ring must be inelastically deformed into a particular configuration. Since the sealing ring is irreparably deformed by its installation, after separation of the two couplings for maintenance or reasons, it would be necessary to replace the sealing ring before the two couplings could be rejoined. Such a "use once and throw away" approach is wasteful, expensive, and troublesome if the replacement ring is not readily available. A coupling between two members of similar material, which can be joined and separated without requiring a new sealing ring each time is needed. Moreover, if the two members to be joined were made of a fluorocarbon polymer instead of metal, an often advantageous arrangement in electronic equipment, a fluorocarbon polymer sealing ring would no longer be effective since the mechanism based on dissimilar coefficients of thermal contraction between the sealing ring and the member it envelops would no longer exist.

Another type of seal for operation at cryogenic temperatures is known from U. S. Pat. No. 3,361,430 issued Jan. 2, 1968 to Reid for a TEMPERATURE COMPENSATING SEAL. The temperature compensating seal known from Reid is assembled from a number of complex force components. This seal is circular and has an axially open, U-shaped body with a flexible sealing portion. A circular wound spring is located in the U-shaped body and it holds the flexible portion against the surface to be sealed. This spring holds the flexible sealing portion against the surface to be sealed at normal to cool temperatures. However, as the spring is cooled to cryogenic temperatures, the circular wound spring contracts and begins to lose its ability to hold the sealing portion in sealing engagement with the surface to be sealed. At cryogenic temperatures, the circular wound spring is unable to hold the flexible sealing portion of the seal against the surface to be sealed.

For cryogenic temperature operation, a second, temperature responsive ring which circumferentially contracts as the temperature decreases is included in the device of Reid. As the ring contracts, it pushes down on a series of levers spaced around the circumference of the seal. These levers pivot on fulcrums, which are an integral part of the U-shaped seal body, and provide a radially outward force to aid the diminished force of the circular wound spring. Together, at cryogenic temperatures, they sufficiently press the flexible portion of the seal into sealing engagement with the surface to be sealed.

There are a number of problems with this known device. First, it is a fairly complex design for a seal. It requires a U-shaped seal body with a circular wound spring and a series of levers mounted therein. One side of the U-shaped body is extended to receive a temperature responsive ring. The extended side also has a ridge thereon which acts as a fulcrum for each of the levers. Second, these pieces must be carefully assembled to function properly, thereby incurring labor costs. Finally, the design requires a chamber in which the seal can seat. This chamber must be carefully formed in the pieces to be sealed, thereby incurring manufacturing costs.

It is an object of this invention to provide a seal for a plastic cryogenic enclosure.

It is another object of this invention to provide a re-usable seal for a plastic cryogenic enclosure.

It is a further object of this invention to provide a simple and inexpensive seal at cryogenic temperatures for a joint between two plastic pieces.

SUMMARY OF THE INVENTION

Briefly stated, in accordance with one aspect of the invention, the foregoing objects are achieved by providing a fluid seal for a cryogenic enclosure. This fluid seal includes a first enclosure portion and a second enclosure portion, each having a respective substantially cylindrical region. Each substantially cylindrical region has an inner substantially cylindrical surface, which defines an axially open chamber, and an outer surface. An engaging mechanism for engaging the first enclosure portion with the second enclosure portion is a part of one or both of the inner substantially cylindrical surfaces. Further, a device is located within both the inner substantially cylindrical surfaces for tightening the engagement of the engagement mechanism between the first enclosure portion and the second enclosure portion as the chambers are filled with a cryogenic fluid.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiments taken in conjunction with the accompanying drawings in which:

DETAILED DESCRIPTION OF PREFERRED EMBODIMENTS

Figure 1:
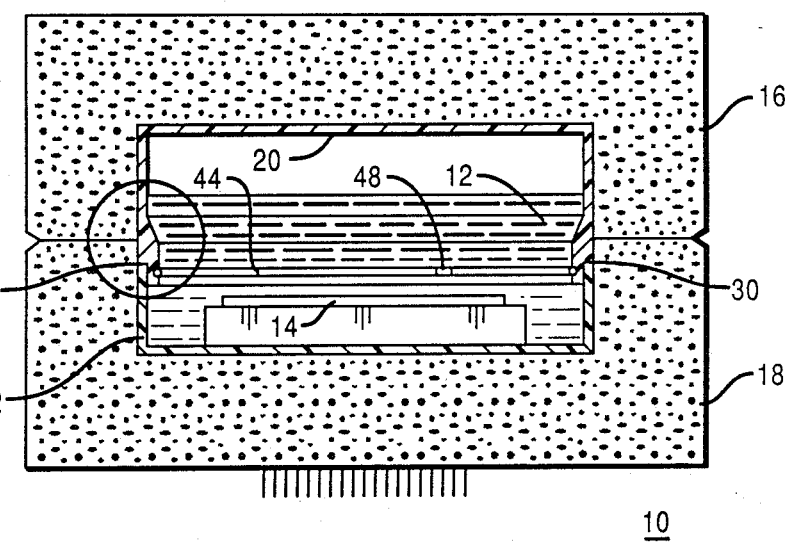
FIG. 1 is a cross section front view of one embodiment of an enclosure according to the invention.

Referring to FIG. 1, there is shown a cross section front view of a cryogenic enclosure 10 in accordance with the present invention. The cryogenic enclosure 10 is substantially cylindrical, but the invention would apply to any three dimensional shape with a substantially circular cross section. The cryogenic enclosure 10 contains a cryogenic fluid 12, such as liquid nitrogen or liquid helium, to cool a device 14, such as a semiconductor device. Surrounding the outside of the cryogenic enclosure 10 is an upper insulator 16 and a lower insulator 18. The insulators 16, 18 are made of a low density material such as polystyrene foam. The insulators 16,18 reduce the amount of heat loss to the environment and prevent the condensation of moisture on the outside of the enclosure 10 when it is filled with the cryogenic fluid 12.

Inside the upper insulator 16 and the lower insulator 18, an upper container portion 20 and a lower container portion 22 are respectively located. These container portions are substantially circular, as the enclosure 10 is. When these container portions 20, 22 are connected along their common substantially circular section, they form a joint 30.

In FIG. 1 the enclosure 10 is shown in the horizontal orientation with the level of the cryogenic fluid 12 covering all sections of the joint 30. However, the invention operates equally as well when the enclosure 10 is in a vertical orientation with only part of the joint 30 covered by the cryogenic fluid 12. Regardless of the orientation, if the joint 30 is located below the level of the cryogenic fluid 12, it must seal the container portions 20, 22 together without leakage. Leakage of the cryogenic fluid 12 could cause undue energy loss, and ice formation and/or water condensation in unwanted places.

Figure 2:
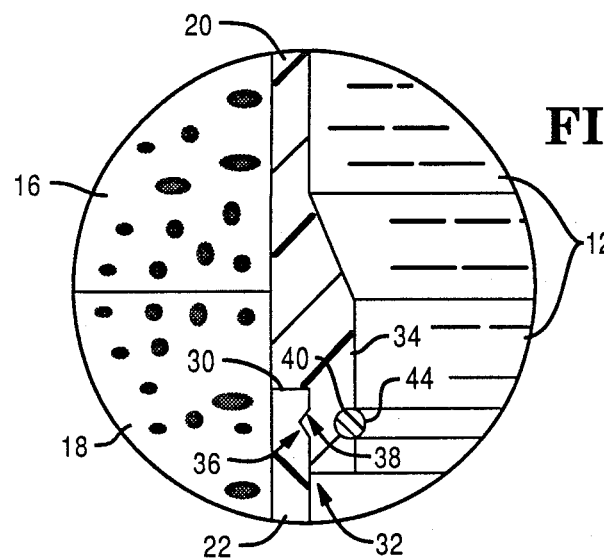
FIG. 2 is an enlarged view detailing the encircled portion of FIG. 1.

Referring now to FIG. 2, the details of a seal 32 are shown in this expanded view of the FIG. 1. As shown in FIG. 2, the upper container portion 20 has a telescoping lip 34 which overlaps the lower container portion 22. The seal 32 between the telescoping lip 34 and the lower container portion 22 prevents leakage therethrough. The seal 32 includes a groove 36 encircling the inner surface of the lower container portion 22. The seal 32 also includes a ridge or protrusion 38 formed on and encircling an outer surface of the telescoping lip 34. The protrusion 38 is adapted to fit tightly into the groove 36. Additionally, another groove 40 encircles an inner surface of the telescoping lip 34 in substantially radial opposition to the protrusion 38. A ring 44 is mounted into the groove 40. The ring 44 is not continuous, but has a slight gap 48 therein (see FIG. 1).

The gap allows the ring 44 to be radially compressed in order to be pressed into the groove 40. Once in the groove 40, the outer diameter of the ring 44 exerts a slight pre-load force on the surface of the groove 40. This places a slight pre-load on the telescoping lip 34 and expands the telescoping lip 34 accordingly. The expansion is not sufficient to prevent the lower container portion 22 from sliding over and overlapping the telescoping lip 34 until the protrusion 38 forms a sealing engagement with the groove 36. These structural relationships are described as they exist at normal temperatures.

With the enclosure assembled as shown in FIGS. 1 and 2, the protrusion 38 will be sealably engaged with the groove 36 at normal temperatures. The groove 36, protrusion 38, groove 40, and ring 44 all tend to contract as the temperature decreases to the cryogenic range. Since the groove 36, the protrusion 38 and the groove 40 are all formed in components made from the same material, fluorocarbon polymer, they will all contract at substantially the same rate. But, because the inner surface will be in direct contact with the cryogenic fluid 12, the telescoping lip 34 and the protrusion 38 which it supports contract slightly more than the groove 36. Such a condition could cause loss of the sealing engagement between the protrusion 38 and the groove 36.

The ring 44 is located inside of the telescoping lip 34 radially opposite both the protrusion 38 and the groove 36 to prevent just such a loss of sealing engagement. The ring 44 is made from a metal which has a smaller coefficient of thermal contraction than that for fluorocarbon polymers. Thus, as the temperature decreases to the cryogenic range, the lower container 22 and the telescoping lip 34 contract substantially together and radially compress the ring 44. The ring 44 contracts too, but not as much as the fluorocarbon polymer components. Thus, the lower container 22 and the telescoping lip 34 will compress the ring until the gap 48 is closed. After the gap 48 has closed, the ring 44 can only be compressed slightly by the relative contraction of the lower container 22 and the telescoping lip 34. At this point, the protrusion 38 is elastically compressed into the groove 36 forming a tight sealing engagement with the sides thereof.

Since the sealing engagement uses the elastic compression of one fluorocarbon polymer component against another, all that is required to separate the upper container portion 20 from the lower container portion 22 is to allow them to return to normal temperatures and pull gently on the upper container portion 20 sufficiently to disengage the protrusion 38 from the groove 36. Because there is no inelastic deformation involved, the separation and re-joining may be done without having to replace one of the seal components.

Figure 4:
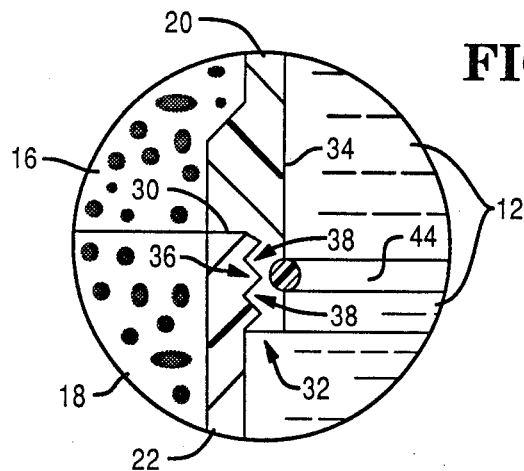
FIG. 4 is an enlarged view detailing the encircled portion of FIG. 3.
Figure 3:
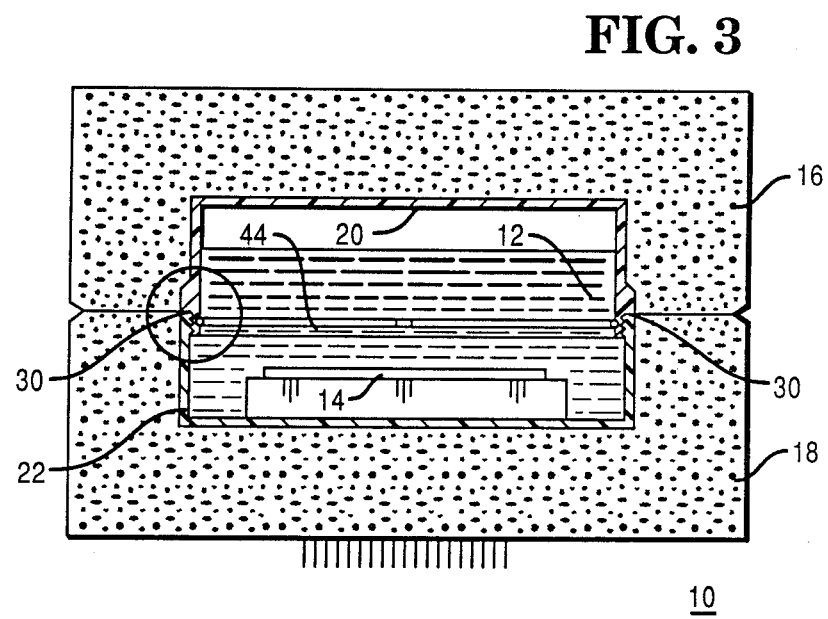
FIG. 3 is a cross section front view of another embodiment of an enclosure according to the invention.

Shown in FIGS. 3 and 4 is an alternative embodiment wherein the groove 34 and the protrusion 36 have been fashioned as matching helical threads.

Thus, it will now be understood that there has been disclosed a temperature differential seal which provides an arrangement for sealing two fluorocarbon polymer components without irreparably deforming any part thereof.

As will be evident from the foregoing description, certain aspects of the invention are not limited to the particular details of the example illustrated, and it is therefore contemplated that other modifications or applications will occur to those skilled in the art, such as putting the protrusion on the outer container portion and its matching groove on the telescoping lip. It is accordingly intended that the claims shall cover all such modifications and applications which do not depart from the true spirit and scope of the invention.

What is claimed as new and desired to be secured by Letters Patent of the United States is:

1. A wide temperature range seal for an enclosure, comprising:
    a first member having a first substantially cylindrical wall;
    said first substantially cylindrical wall having a ridge circumferentially located on a first outer wall surface thereof and a first inner wall surface defining a chamber;
    said first inner wall surface having a first groove in radial opposition to said ridge;
    a second member having a second substantially cylindrical wall having a second groove in an inner wall surface engaging said ridge; and
    a ring member, having a thermal expansion coefficient that is lower than a thermal expansion coefficient of said first member and said second member, said ring member mounted in said first groove, whereby as the temperature of said first member, said second member and said ring member is lowered, said ridge of said first member and said second groove of said second member compress against each other and against said ring member to seal the enclosure.

2. A wide temperature seal as set forth in claim 1, wherein said inner surface of said second member defines a second chamber communicating with said first chamber.

3. A wide temperature seal as set forth in claim 2, wherein said ridge is an external helical thread, and said second groove is formed by a complementary internal helical thread.

4. A wide temperature seal as set forth in claim 3, wherein said first and second members are made of a fluorocarbon polymer.

5. A wide temperature range seal comprising:
    a first member having a first substantially cylindrical wall;
    said first substantially cylindrical wall having a first groove circumferentially located in a first outer wall surface thereof and a first inner wall surface defining a chamber;
    said first inner wall surface having a second groove in radial opposition to said first groove;
    a second member having a second substantially cylindrical wall having a ridge on an inner wall surface engaging said first groove; and
    a ring member having a thermal expansion coefficient that is lower than a thermal expansion coefficient of said first member and said second member mounted in said second groove, whereby as the temperature of said first member, said second member and said ring member is lowered, said first groove of said first member and said ridge of said second member compress against each other and against said ring member to seal said chamber.

6. A wide temperature seal as set forth in claim 5, wherein said inner surface of said second member defines a second chamber communicating with said chamber.

7. A wide temperature seal as set forth in claim 6, wherein said ridge is an external helical thread, and said first groove is a complementary internal helical thread.

8. A wide temperature seal as set forth in claim 7, wherein said first and second members are made of a fluorocarbon polymer.

9. A fluid seal for a cryogenic enclosure comprising:
    a first enclosure portion and a second enclosure portion, each having a respective substantially cylindrical region;
    each substantially cylindrical region having an inner substantially cylindrical surface defining a axially open chamber and an outer surface;
    means for engaging said first enclosure portion with said second enclosure portion as a part of at least one of said inner substantially cylindrical surfaces; and
    means located within both said inner substantially cylindrical surfaces for tightening the engagement of said engagement means between said first enclosure portion and said second enclosure portion as said chambers are filled with a cryogenic fluid.

10. A fluid seal for a cryogenic enclosure as set forth in claim 9, wherein said first enclosure portion and said second enclosure portion are made of a fluorocarbon polymer.

11. A fluid seal for a cryogenic enclosure comprising:
    a first enclosure portion and a second enclosure portion, each having a respective substantially cylindrical region;
    each substantially cylindrical region having a substantially cylindrical inner surface defining a axially open chamber, and a substantially cylindrical outer surface;
    said first enclosure portion having a first helical thread on its substantially cylindrical outer surface;
    said second enclosure portion having a second helical thread on its substantially cylindrical inner surface for threadedly engaging said first helical thread; and
    means located inside of and adjacent to said first enclosure portion for locking the threaded engaging of said first enclosure portion to said second enclosure portion as said chambers are filled with a cryogenic fluid.

12. A fluid seal for a cryogenic enclosure as set forth in claim 11, wherein said first enclosure portion and said second enclosure portion are made of a fluorocarbon polymer.

* * * * *